US008787095B2

(12) United States Patent
Chen

(10) Patent No.: US 8,787,095 B2
(45) Date of Patent: Jul. 22, 2014

(54) SYSTEMS, AND DEVICES, AND METHODS FOR PROGRAMMING A RESISTIVE MEMORY CELL

(75) Inventor: Xiaonan Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 13/407,007

(22) Filed: Feb. 28, 2012

(65) Prior Publication Data

US 2013/0223163 A1    Aug. 29, 2013

(51) Int. Cl.
*G11C 7/10*    (2006.01)

(52) U.S. Cl.
USPC ............... 365/189.011; 365/163; 365/189.16

(58) Field of Classification Search
USPC ............... 365/189.011, 163, 189.16
See application file for complete search history.

(56) References Cited

U.S. PATENT DOCUMENTS

| 6,115,285 | A | 9/2000 | Montanari et al. |
| 7,450,415 | B2 | 11/2008 | Kim et al. |
| 7,688,621 | B2 * | 3/2010 | Cho et al. ............... 365/163 |
| 7,728,319 | B2 | 6/2010 | Goux et al. |
| 7,787,291 | B2 | 8/2010 | Resta et al. |
| 7,897,953 | B2 | 3/2011 | Liu |
| 8,036,016 | B2 | 10/2011 | Sarker et al. |
| 8,169,819 | B2 | 5/2012 | Shima et al. |
| 8,194,441 | B2 | 6/2012 | Thiruvengadam |
| 8,199,566 | B1 | 6/2012 | Fackenthal et al. |
| 8,441,848 | B2 | 5/2013 | Thiruvengadam et al. |
| 8,531,884 | B2 * | 9/2013 | Min et al. ............... 365/185.14 |
| 2009/0040813 | A1 | 2/2009 | Kang et al. |
| 2010/0226168 | A1 * | 9/2010 | Savransky ............... 365/163 |
| 2011/0051507 | A1 | 3/2011 | Sarkar et al. |
| 2011/0051508 | A1 | 3/2011 | Eleftheriou et al. |

FOREIGN PATENT DOCUMENTS

| JP | 2007-026644 | 2/2007 |
| JP | 2009-252253 | 10/2009 |
| WO | WO 2009/114200 A1 | 9/2009 |

OTHER PUBLICATIONS

Bedeschi et al., "A Bipolar-Selected Phase Change Memory Featuring Multi-Level Cell Storage", *IEEE Journal of Solid-State Circuits*; vol. 44, No. 1, Jan. 2009; pp. 217-227.
Bedeschi et al., "A Multi-Level-Cell Bipolar-Selected Phase-Change Memory", *IEEE International Solid-State Circuits Conference*; ISSCC 2008/Session 23/Non-Volatile Memory/23.5; pp. 428-429, 625.
Chao et al., "Multi-Level Phase Change Memory Using Slow-Quench Operation: GST vs. GSST", *IEEE*; 2009; pp. 39-40.
Kang et al., "Two-bit Cell Operation in Diode-Switch Phase Change Memory Cells with 90nm Technology", *IEEE-Symposium on VLSI Technology Digest of Technical Papers*; 2008; pp. 98-99.

(Continued)

*Primary Examiner* — Son Dinh
*Assistant Examiner* — Nam Nguyen
(74) *Attorney, Agent, or Firm* — Knobbe, Martens, Olson & Bear LLP

(57) ABSTRACT

Embodiments disclosed herein may relate to programming a memory cell with a programming pulse that includes a quenching period. The quenching period includes an initial portion and a subsequent portion, with the subsequent portion different than the initial portion. During the initial portion, the amplitude of the programming pulse may be reduced to a first target amplitude level, and during the subsequent portion, the amplitude of the programming pulse may be further reduced to a second target amplitude level.

19 Claims, 7 Drawing Sheets

(56) References Cited

OTHER PUBLICATIONS

Lee et al., "A 90nm 1.8V 512Mb Diode-Switch PRAM with 266MB/s Read Throughout", *IEEE International Solid-State Circuits Conference*; ISSCC 2007/Session 26/Non-Volatile memories/ 26.1; pp. 472-473, 616.

Lin et al., "Operation of Multi-Level Phase Change Memory Using Various Programming Techniques", *IEEE*; 2009; 4 pages.

Nirschl et al., "Write Strategies for 2 and 4-bit Multi-Level Phase-Change Memory", *IEEE*; 2007; pp. 461-464.

Philipp, et al, "Optimization of Phase Change RAM Write Performance for Large Memory Array, "IEEE, Sep. 23, 2009, 3 Pages.

\* cited by examiner

SYSTEMS, AND DEVICES, AND METHODS FOR PROGRAMMING A RESISTIVE MEMORY CELL

FIELD

Subject matter disclosed herein may relate to integrated circuit devices, and may relate, more particularly, to circuitry associated with memory.

INFORMATION

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for a particular application may include, physical size, storage density, operating voltages, granularity of read/write operations, throughput, transmission rate, and/or power consumption, for example. Other example factors that may be of interest to system designers may include cost of manufacture, ease of manufacture, and/or reliability.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering suitability for a particular application may include physical size, storage density, operating voltages, granularity of read/write operations, throughput, transmission rate, and/or power consumption. Other example factors that may be of interest may include cost of manufacture, and/or ease of manufacture. One example aspect of memory array design that may affect one or more factors may include integrated circuit die size. One or more process technologies utilized to manufacture a memory device may at least in part affect some of the factors, such as those mentioned above, including storage density, physical size, cost/ease of manufacture, and/or reliability for example. In an embodiment, multi-level programming (MLP) capabilities for one or more cells in a memory may be utilized to increase storage density, for example. As used herein, "multi-level programming" may refer to one or more cells of a memory device capable of being programmed to any of more than two states (referred to hereinafter as "programmed states"). For example, a single-level phase change memory (PCM) cell may be programmed to a "set" state or a "reset" state. A multi-level PCM cell may be programmed to one or more intermediate states between a full set state and/or a full reset states, in an embodiment, for example.

Figure 1:
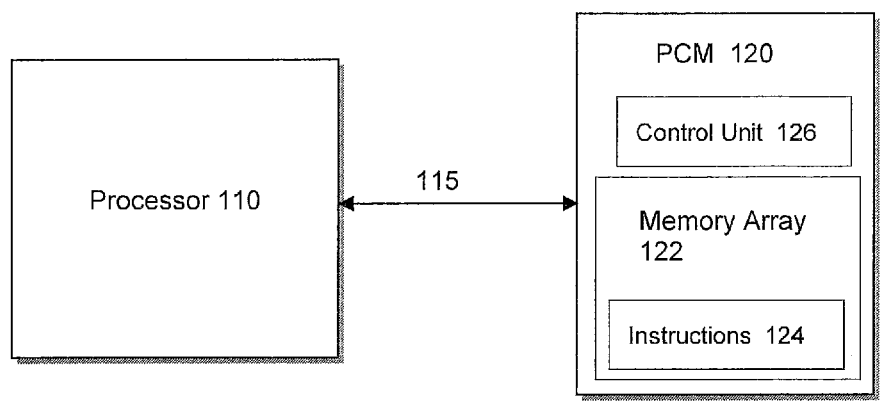
FIG. 1 is a schematic diagram depicting an example computing platform including a phase change memory device, according to an embodiment.

FIG. 1 is a schematic diagram depicting an example computing platform 100 including an example phase change memory (PCM) device 120. In an embodiment, PCM device 120 may comprise a storage area including an array 122 of PCM cells, such as in accordance with one or more examples. PCM device 120 may, in an example embodiment, be communicatively coupled to a processor 110 by way of an interconnect 115.

PCM device 120 in an embodiment may comprise a control unit 126. Additionally, memory array 122 may store instructions 124 that may include one or more applications that may be executed by processor 110, according with an embodiment. Processor 110 may generate a memory access command, to be received by, for example, PCM device 120. Control unit 126 may program one or more cells of memory array 122 at least in part in response to being initiated by processor 110, such as resulting from a memory access command, according to an embodiment. Of course, computing platform 100 is merely one example of a system implemented in accordance with claimed subject matter, and claimed subject matter is not limited in scope in these respects.

In an embodiment, one or more PCM cells of memory array 122 may comprise a chalcogenide glass material. A particular cell of a memory device, such as PCM device 120, may be programmed to one or more of at least two different programmed states. For example, in a binary system, programmed states may comprise a "0" or a "1." In an embodiment, a "set" state, representing a binary value of '1,', for example, may correspond to a more crystalline, more conductive state for a cell, such as one or more cells of memory array 122. Also, in an embodiment, a "reset" state, representing a binary value of '0,' for example, may correspond to a more amorphous, more resistive state of a material for a cell, such as one or more cells of memory array 122. In another embodiment, at least some cells may be programmed to a state from out of more than two programmed states, as represented by levels of resistance in a memory cell for an embodiment.

In a PCM device, heat sufficient to change a phase of a cell, such as a cell of memory array 122, may be achieved by utilization of a current and/or voltage pulse with respect to a cell, such as one or more cells of memory array 122, in an embodiment. Further, in one or more example embodiments, memory arrays may comprise one or more technologies other than PCM, such as other resistive memory technologies and/or other types of memory. Therefore, claimed subject matter is not limited in scope to PCM, for example.

In an example embodiment, heat sufficient to change a phase of a cell, such as one or more PCM cells of memory array 122, may result, at least in part, from current flow through a cell. In an embodiment, a current may flow through a PCM cell, such as one or more cells of memory array 122, at least in part as a result of a voltage difference across electrodes for one or more cells, for example.

In an embodiment, an amount of current to flow through a PCM cell, such as one or more cells of memory array 122, may depend at least in part on a resistance of a PCM cell, such as one or more cells of memory array 122. In an embodiment, a PCM cell, such as one or more cells of memory array 122, for example, may have different, measurable, resistance characteristics, depending at least in part on whether a cell is programmed to a more conductive, set state or to a more resistive, reset state, or to one or more intermediate states between a set state and a reset state, although claimed subject matter is not limited in scope in this respect.

In an embodiment, a PCM device, such as PCM device 120, may, for example, detect a programmed state of a particular cell based at least in part on a ratio of a resistance of a particular cell in a set state to a resistance of the particular cell in a reset state. Also, in an embodiment, one or more electrical programming pulses, such as current and/or voltage pulses, may be used (e.g., adjusted) to program to program a cell to an appropriate resistance level according to a target programmed state.

The term "computing platform" as used herein refers to a system and/or a device that includes the ability to process and/or store signals and/or states. Thus, a computing platform, in this context, may comprise hardware, software, firmware or any combination thereof (other than software per se). Computing platform 100, as depicted in FIG. 1, is merely one such example, and the scope of claimed subject matter is not limited to this particular example. For one or more embodiments, a computing platform may comprise any of a wide range of electronic devices, including digital devices, such as including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein may also be executed and/or controlled, in whole or in part, in conjunction with utilization of a computing platform.

Figure 2:
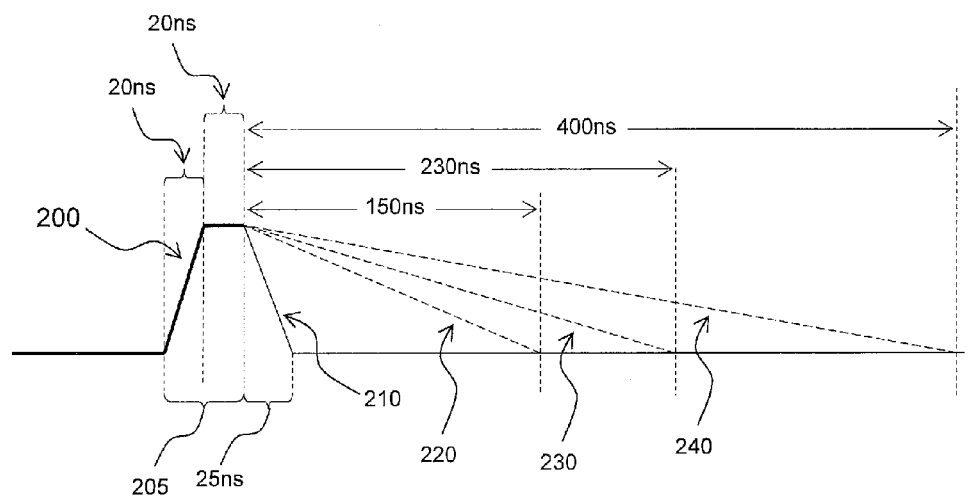
FIG. 2 is an illustration depicting an example programming voltage and/or current pulse for a memory, according to an embodiment.

FIG. 2 is an illustration of an example electrical programming pulse 200, such as a current and/or voltage pulse, that may be used in an example embodiment of a phase change memory storage cell to program a multi-level cell, such as one or more cells of memory array 122 to a target programmed state. In an embodiment, an initial period 205 of the programming pulse 200 may be sufficient to result in melting of at least a portion of PCM material for a memory cell. In an embodiment, a rise time for (e.g., the leading edge of) the initial period 205 may comprise approximately 20 ns, although claimed subject matter is not limited in scope in this respect. Also, in an embodiment, a peak pulse amplitude during the initial period 205 may be maintained for a duration of approximately 20 ns, although again, claimed subject matter is not limited in scope in this respect. In an embodiment, maintaining the initial period 205 of pulse 200 at an approximately peak amplitude may be sufficient to result in melting of at least a portion of a phase change material of a cell.

As depicted in FIG. 2, example programming pulse 200 may also comprise a quench(ing) period, such as one including one of falling edges 210, 220, 230, and/or 240. In an embodiment, example falling edges 210, 220, 230, and/or 240 of example programming pulse 200 may individually comprise separate quenching periods. As used herein, "quenching period" may refer to an amount of time for an amplitude level of an electrical programming pulse to fall from at least a first target threshold level to a second target threshold level, such as from an amplitude level at which melting occurs to an amplitude level at which melting has substantially ceased. It is likewise noted that a quench(ing) period may be divided into portions, such as an initial portion and a subsequent portion that may in combination comprise a quench(ing) period. A quench period comprising an example falling edge, such as 210, may have a duration comprising, for example, approximately 25 ns, although claimed subject matter is not limited in scope in this respect. A relatively quick cooling of PCM cell material, such as corresponding to a quenching period of approximately 25 ns, in an embodiment, may be sufficiently quick so that formation of a crystalline structure within PCM cell material does not substantially occur, but rather an amorphous state for PCM cell material may result. Also, in an embodiment, a longer quenching period for an electrical programming pulse may result in a less resistive state for a PCM cell as compared with a shorter quenching period for an electrical programming pulse. That is, increasingly long quench periods may result in respectively decreasing levels of resistance in memory cells, for example. By adjusting quenching periods for programming pulses, varying resistivity characteristics for a PCM cell may be achieved. In an embodiment, as depicted in FIG. 2, a quenching period comprising an example falling edge, such as 220, may comprise approximately 150 ns, a quench period comprising an example falling edge, such as 230 may comprise approximately 230 ns, and a quench period comprising an example falling edge, such as 240 may comprise approximately 400 ns. However, claimed subject matter is not limited in scope in these respects.

Figure 3:
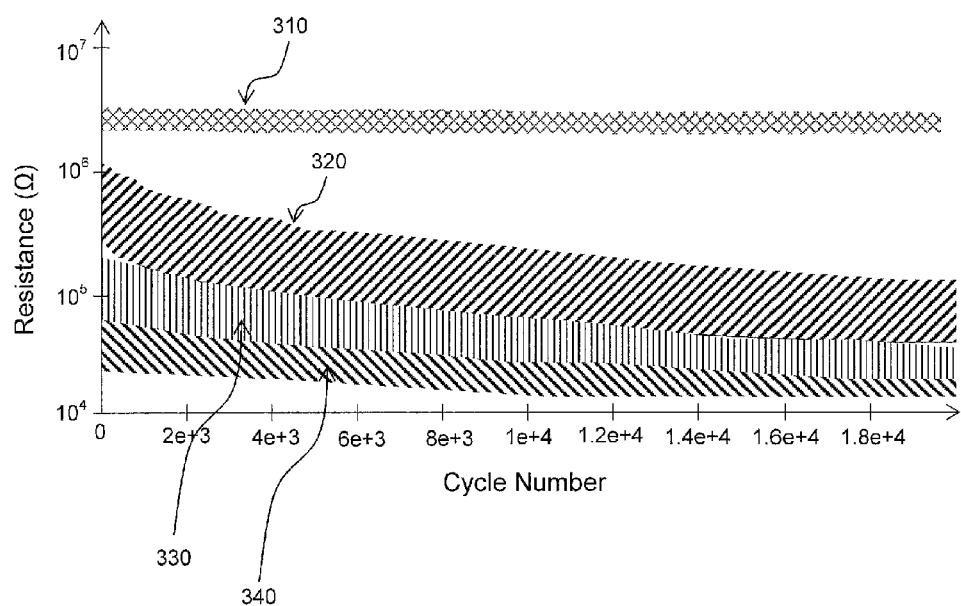
FIG. 3 is an illustration depicting example resistance characteristics associated with example programming voltage and/or current pulses for one or more memory cells, according to an embodiment.

FIG. 3 is an illustration of a plurality of resistance ranges for an example phase change memory cell that may result from use of example programming pulses having example quenching periods, such as depicted in FIG. 2 in connection with example programming pulse 200 and example falling edges 210, 220, 230, and/or 240). In FIG. 3, example resistance ranges for various example quenching periods are depicted over a relatively large amount of programming cycles in an example phase change memory device. For example, a resistance range 310 may correspond to example falling edge 210 of approximately 25 ns, in an embodiment. As may be noted in FIG. 3, a relatively short quenching period may result in a relatively high resistance level, as indicated by resistance range 310. Also, for additional examples, a resistance range 320 may correspond to example falling edge 220 of approximately 150 ns, a resistance range 330 may correspond to example falling edge 230 of approximately 230 ns, and/or a resistance range 340 may correspond to example falling edge 340 of approximately 400 ns, in an embodiment. However, claimed subject matter is not limited in scope in these respects. It is noted that rather than a duration of time, a slope or average slope associated with a falling edge may likewise provide a mechanism to characterize a quenching period, for example. For example, initial and subsequent portions of a quenching period may have substantially similar durations, but the initial portion may have a different slope than a subsequent portion of the quenching period. However, continuing with a duration of time as a mechanism to characterize or describe quenching, note, as depicted in FIG. 3, increasingly long quenching periods may result in decreased resistance levels. Therefore, by selecting an appropriate quenching period for a programming pulse, a particular phase change memory cell may be programmed to a target state corresponding to a target range of resistance values. By selecting from a plurality of different quenching periods for a programming pulse, different states may be selectively programmed, for example.

Further, as may be additionally noted in FIG. 3, for a programming pulse employing substantially the same parameters over time, resistance levels produced may tend to decrease as a cell is programmed repeatedly over time. A decrease in resistance levels from employing a programming pulse of substantially the same parameters, for example, may make it more difficult to discern distinct programmed states, thereby potentially negatively affecting memory reliability.

Figure 4:
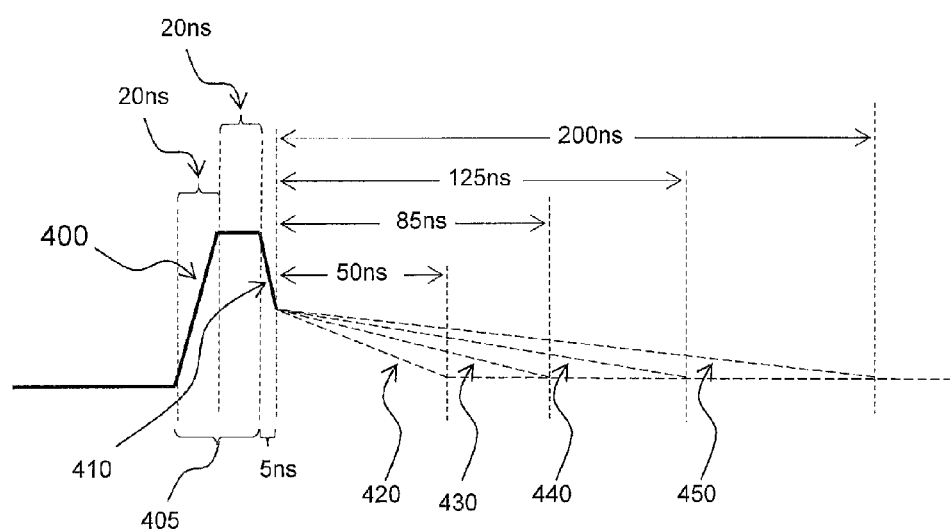
FIG. 4 is an illustration depicting an example programming voltage and/or current pulse for a memory, according to an embodiment.

FIG. 4 is an illustration of an example electrical programming pulse 400 that may be used in an example embodiment, such as a phase change memory device, to program a multi-level memory cell, such as one or more cells of memory array 122, to a target programmed state. In an embodiment, an initial period 405 of pulse 400 may reach a magnitude and/or have a duration sufficient to melt at least a portion of PCM material. In an embodiment, a rise time for (e.g., a leading edge of) the initial period 405 of programming pulse 400 may comprise approximately 20 ns, although claimed subject matter is not limited in scope in this respect. Also, in an embodiment, a peak amplitude during the initial period 405 may be maintained for a duration of approximately 20 ns, although again, claimed subject matter is not limited in scope in this respect. In an embodiment, maintaining the initial period 405 of pulse 400 at an approximately peak amplitude may be sufficient to result in melting of at least a portion of phase change material of a cell.

As depicted in FIG. 4, example programming pulse 400 may also comprise a relatively quick initial portion 410 of a quenching period, in an embodiment. For example, initial portion 410 of a quenching period of example programming pulse 400 may comprise a fall time of approximately 5 ns, although claimed subject matter is not limited in scope in this respect. In an embodiment, initial portion 410 of a quenching period of example programming pulse 400 may comprise a duration of time in which programming pulse 400 may fall from a first target amplitude or approximately a first target amplitude, such as a peak amplitude or an approximately peak amplitude, to a second target amplitude or an approximately second target amplitude, such as an intermediate amplitude. In an embodiment, an intermediate amplitude may comprise a level of approximately 50% of z peak amplitude or an approximately peak amplitude, although claimed subject matter is not limited in scope in this respect.

Also depicted in FIG. 4 are several possible subsequent portions of the quenching period, indicated in FIG. 4, by example falling edges 420, 430, 440, and/or 450. In an embodiment, example falling edges 420, 430, 440, and/or 450 of example programming pulse 400 may individually comprise separate subsequent portions that may continue from an amplitude level at which an initial portion of the quenching period may cease and that may individually fall at a different rate, such as from an intermediate amplitude to an amplitude level at which substantially no melting takes place, for example. As used herein, a "subsequent" portion may refer to a portion of a quench period beginning at a conclusion of an initial portion of the quench period and continuing until a level of amplitude at which substantially no melting takes place. For example, an amplitude level of substantially no current and/or voltage may comprise one example. For example, a subsequent portion 420 of an example quenching period may comprise approximately 50 ns, a subsequent portion 430 of an example quenching period may comprise approximately 85 ns, a subsequent portion 440 of an example quenching period may comprise approximately 125 ns, and/or a subsequent portion 450 of an example quenching period may comprise approximately 200 ns. However, claimed subject matter is not limited in scope in these respects. By using different subsequent portions for a quenching period of an electrical programming pulse, varying resistivity characteristics for a PCM cell may be achieved.

By combining a relatively quick initial portion with a subsequent portion of a quenching period, overall cell programming time may be reduced as compared to other or state of the art approaches. Additionally, multiple selectable subsequent portions of a quenching period may provide the ability to program a phase change memory cell to one of a plurality of discrete programmed states corresponding to a plurality of respective resistance ranges, in an embodiment. An additional potential advantage of combining a relatively quick initial portion with a subsequent portion of a quenching period may include a reduction in power consumption for programming operations. Of course, claimed subject matter is not limited in scope to particular example quenching periods or portions and/or resistance ranges described herein.

Figure 5:
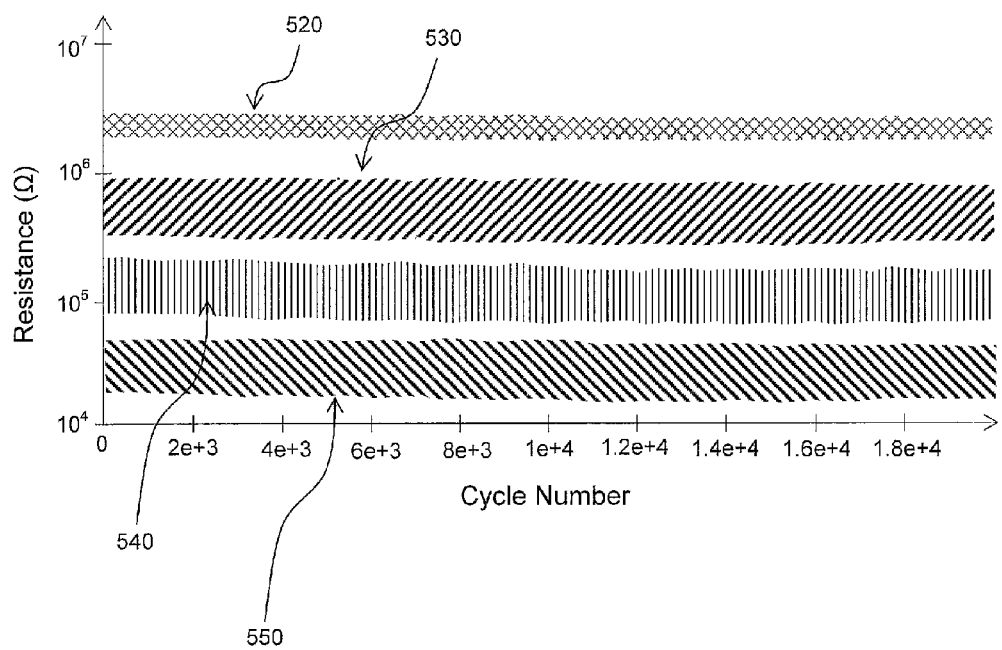
FIG. 5 is an illustration depicting example resistance characteristics associated with example programming voltage and/or current pulses for one or more memory cells, according to an embodiment.

FIG. 5 is an illustration of a plurality of resistance ranges for an example phase change memory cell that may result from use of example programming pulses having corresponding subsequent portions of a quenching period, such as depicted in FIG. 4 in connection with example programming pulse 400 and example falling edges 420, 430, 440, and/or 450. As discussed above, and as depicted in FIG. 4, example programming pulse 400 may comprise an initial portion 410 of a quenching period, followed by a selected subsequent portion of the quenching period. In FIG. 5, example resistance ranges for various example subsequent portions are depicted over a relatively large amount of programming cycles in an example phase change memory device. For example, a resistance range 520 may correspond to example falling edge 420 of approximately 50 ns, in an embodiment. As may be noted in FIG. 5, a relatively short subsequent portion of a quenching period may result in a relatively high resistance level, as indicated by resistance range 520. Also, for additional examples, a resistance range 530 may correspond to example falling edge 430 of approximately 85 ns, a resistance range 540 may correspond to example falling edge 440 of approximately 125 ns, and/or a resistance range 550 may correspond to example falling edge 450 of approximately 200 ns, in an embodiment. However, claimed subject matter is not limited in scope in these respects. Additionally, increasingly long subsequent portions of a quenching period may result in decreased resistance levels, for example as depicted in FIG. 5. By selecting an appropriate subsequent portion of a quenching period for a programming pulse for a particular phase change memory cell, a state corresponding to a target range of resistance values may be programmed to a memory cell, in an embodiment.

Further, as may be additionally noted in FIG. 5, for an example programming pulse generated in accordance with claimed subject matter, such as pulse 400, for example, individual resistance ranges corresponding to individual subsequent portions of a quenching period may better maintain their respective resistance levels as a memory device is programmed repeatedly over time as compared to results from other types of programming pulses, such as longer pulses. Additionally, individual resistance ranges corresponding to individual subsequent portions of a quenching period may be more measurably distinct over time as compared to results utilizing longer or state of the art programming pulses, for example. Measurably distinctive resistance ranges may make it easier to accurately detect distinct programmed states of a cell, thereby resulting in potentially improved reliability.

Figure 6:
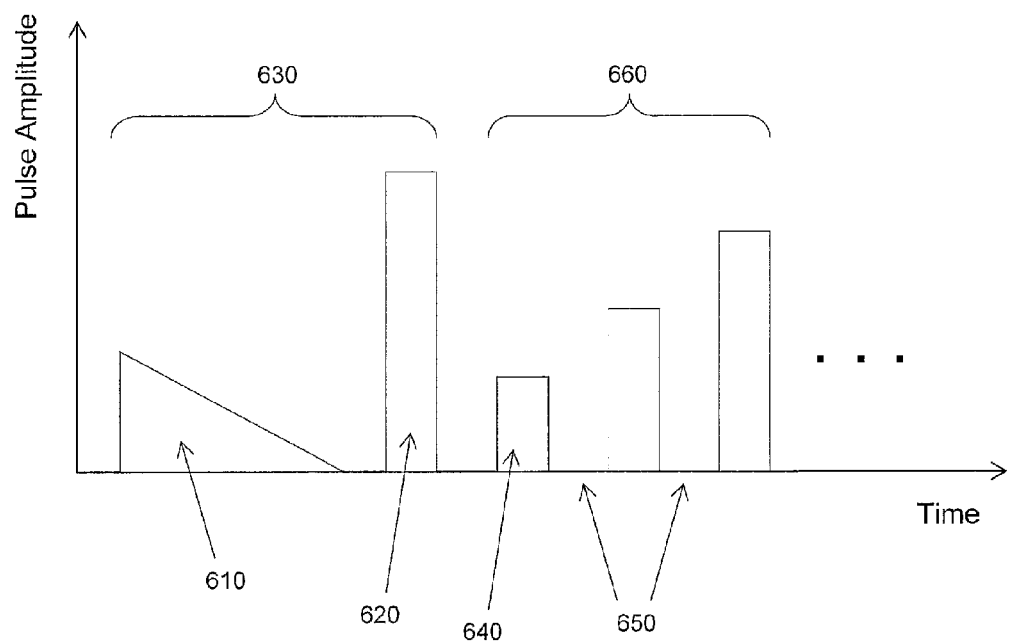
FIG. 6 is an illustration depicting an example programming voltage and/or current pulse sequence for one or more memory cells, according to an embodiment.

FIG. 6 is an illustration depicting an example programming voltage and/or current pulse sequence for one or memory cells. An example programming sequence may commence with an initial sequence 630, comprising a set sweep pulse 610 and a reset pulse 620. A set sweep pulse, such as set sweep pulse 610, may comprise a voltage and/or current pulse intended to result in a set state in a phase change memory cell, for example. A reset pulse, such as reset pulse 620, may comprise a voltage and/or current pulse intended to result in a reset state in a phase change memory cell. An initial sequence, such as initial sequence 630, may be followed by a "staircase up" (SCU) sequence 660, comprising one or more programming voltage and/or current pulses, such as pulse 640. An SCU sequence, such as SCU sequence 660, may comprise one or more pulses, wherein subsequent pulses are increased in magnitude over one or more previous pulses. Also, for an example SCU sequence, verification operations may be performed at points in time 650 between SCU pulses to determine whether a targeted resistance range, and a corresponding target programmed state, for a cell has been achieved. Additionally, for an example SCU sequence, programming voltage and/or current pulses may be ceased in response to a verification operation determining that an appropriate resistance value corresponding to a target programmed state for a phase change memory cell has been achieved. If a determination is made by a verification operation that an appropriate resistance value has not been achieved, a subsequent programming pulse may result and an additional verification operation may be performed. For an example programming voltage and/or current pulse sequence, one of multi-level programmed states may be achieved for a phase change memory cell by using electrical programming pulses of varying amplitude levels in varying numbers of pulses in an SCU sequence.

Figure 7:
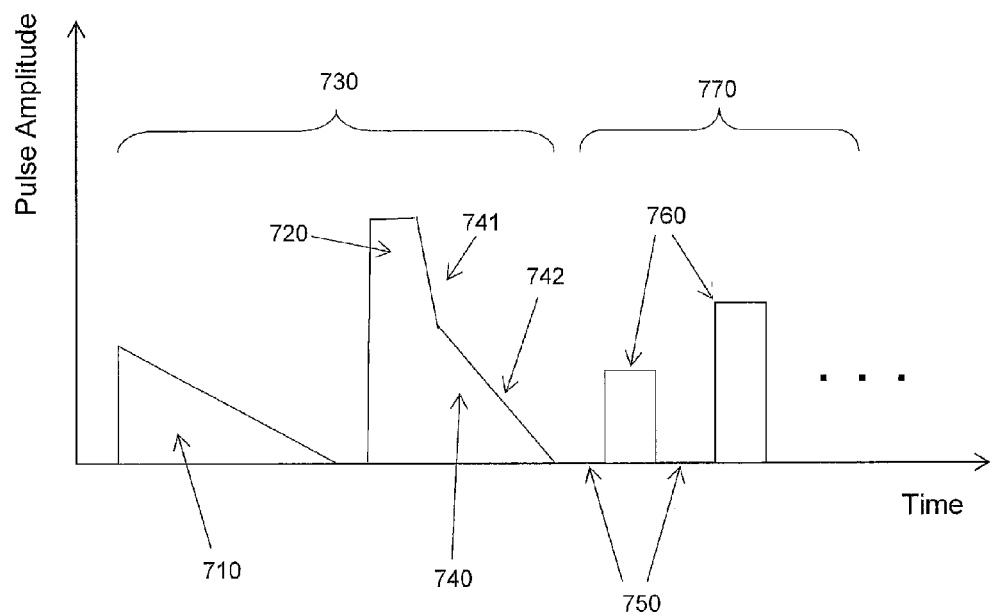
FIG. 7 is an illustration depicting an example programming voltage and/or current pulse sequence for one or more memory cells, according to an embodiment.

FIG. 7 is an illustration depicting an example programming voltage and/or current pulse sequence for a one or memory cells, according to an embodiment. An example programming sequence may commence with an initial sequence, such as initial sequence 730, followed by an SCU sequence, such as SCU sequence 770, in an embodiment. In an example embodiment, an initial sequence, such as initial sequence 730, may comprising a set sweep pulse, such as set sweep 710, that comprises a voltage and/or current pulse intended to result in a set state in a phase change memory cell.

Also in an embodiment, an initial sequence, such as initial sequence 730, may comprise a reset pulse, such as reset pulse 720, having a quenching period, such as quenching period 740, comprising a relatively quick initial portion 741 and a selected subsequent portion 742, for example. In an embodiment, a reset pulse of an initial sequence of a programming sequence for a phase change memory cell may comprise a voltage and/or current pulse in accordance with an example embodiment depicted in FIG. 4 and discussed above in connection with FIGS. 4 and 5. For example, an initial portion of a quenching period 740 of example reset pulse 720 may comprise a duration of time in which reset pulse 720 may fall from a first target (e.g., peak) amplitude level to a second target (e.g., intermediate) amplitude level. In an embodiment, an intermediate amplitude level may comprise a level of approximately 50% of an approximately peak amplitude level, although claimed subject matter is not limited in scope in this respect.

In an embodiment, a subsequent portion of quenching period 740 of example reset pulse 720 may result in a reduced cell resistance as compared with a resistance produced by a typical reset pulse, such as reset pulse 620 depicted in FIG. 6, for example. In an embodiment, a subsequent portion of quenching period for a reset pulse of an initial sequence, such as initial sequence 730, may potentially result in a phase change memory cell having a resistance characteristic closer in value to a resistance corresponding to a target programmed state than would be the case with a typical reset pulse. By a cell potentially achieving a resistance value closer to a resistance value corresponding to a target programmed state, potentially fewer programming voltage and/or current programming pulses, such as voltage and/or current pulses 760, of an SCU sequence, such as SCU sequence 770, may be utilized to program a cell. Additionally, potentially fewer verification operations between programming pulses in an SCU sequence may be utilized, in an embodiment.

In an embodiment, an SCU sequence, such as SCU sequence 770, may comprise one or more pulses, such as pulses 760, wherein subsequent pulses may increase in magnitude over one or more previous pulses. Also, for an example SCU sequence, verification operations may be performed at points in time 750 between SCU pulses to determine whether a target resistance range for a cell has been achieved. In an embodiment, one or more program/verify loops may be performed to achieve a resistance value for a cell according to a target programmed state. For an example programming voltage and/or current pulse sequence, one of multiple programmed states may be achieved for a phase change memory cell by employing pulses of varying amplitudes and by employing varying numbers of pulses in an SCU sequence. However, as mentioned previously, potentially a reduced amount of programming pulses and/or verify operations may be utilized to achieve a given programmed state in an embodiment due at least in part to an initial sequence, such as initial sequence 730, having a reset pulse, such as pulse 720, comprising an extended quenching period, such as quenching period 740, in an embodiment. For example, a phase change memory cell may be programmed to a target state in a reduced amount of time, potentially resulting in increased programming speed and/or memory device reliability and/or system performance. Additionally, if potentially fewer program/verification loops may be used to achieve target programmed states, potentially a reduction in power consumption may be achieved, for example.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other device units designed to perform function described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

Some portions of the preceding detailed description have been presented in terms of logic, algorithms and/or symbolic representations of operations on binary states stored within a memory of a specific apparatus or special purpose computing device or platform. In the context of this particular specification, the term specific apparatus or the like includes a general purpose computing device, such as general purpose computer, once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals and/or states capable of being stored, transferred, combined, compared or otherwise manipulated as electronic signals and/or states representing information. It has proven convenient at times, principally for reasons of common usage, to refer to such signals and/or states as bits, data, values, elements, symbols, characters, terms, numbers, numerals, information, and/or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing device. In the context of this specification, therefore, a special purpose computer and/or a similar special purpose computing device is capable of manipulating and/or transforming signals and/or states, typically represented as physical electronic and/or magnetic quantities within memories, registers, and/or other information storage devices, transmission devices, and/or display devices of the special purpose computer and/or similar special purpose computing device. In the context of this particular patent application, the term "specific apparatus" may include a general purpose computing device, such as a general purpose computer, once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite a change in state.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

The invention claimed is:

1. A method, comprising:
   programming a memory cell with a sequence of electrical pulses, wherein the sequence comprises a set electrical pulse, and wherein the sequence also comprises an electrical pulse, wherein the electrical pulse comprises a quenching period including an initial portion and a subsequent portion, wherein the subsequent portion is different than the initial portion.

2. The method of claim 1, wherein the programming the memory cell comprises reducing an amplitude of the electrical pulse from an initial amplitude level to a target amplitude level during the initial portion of the quenching period.

3. The method of claim 2, wherein the amplitude level comprises at least one of the following: a current amplitude level or a voltage amplitude level.

4. The method of claim 2, wherein the programming the memory cell comprises reducing the amplitude from the target amplitude level, comprising a first target amplitude level, to a second target level during the subsequent portion of the quenching period.

5. The method of claim 1, wherein the programming the memory cell with the electrical pulse comprises the subsequent portion of the quenching period comprising a target falling edge corresponding to a target programmed state.

6. The method of claim 5, wherein the target falling edge, comprising a target duration of time, comprises one of a plurality of falling edges, the plurality of falling edges corresponding to a plurality of respective programmed states.

7. The method of claim 1, further comprising programming the memory cell with an additional electrical pulse to a particular target programmed state.

8. The method of claim 7, further comprising performing a verify operation on the memory cell.

9. The method of claim 7, wherein the programming the memory cell with the additional electrical pulse comprises programming the memory cell with a staircase up sequence of electrical pulses.

10. The method of claim 1, wherein a duration of time of the subsequent portion exceeds a duration of time of the initial portion.

11. A memory device, comprising:
a memory array comprising a plurality of memory cells; and
a control unit to program a memory cell of the plurality of memory cells using an electrical pulse, wherein the electrical pulse comprises a quenching period including an initial portion and a subsequent portion, the subsequent portion being different than the initial portion and having a durations of time equal to or greater than approximately 50 ns.

12. The memory device of claim 11, wherein control unit is further to select the subsequent portion from among a plurality of subsequent portions corresponding to a plurality of respective programmed states.

13. The memory device of claim 11, wherein the initial portion comprises a duration of time of approximately 5 ns.

14. The memory device of claim 11, wherein the control unit is further to program the memory cell using an initial sequence of electrical pulses, wherein the initial sequence comprises a set pulse and the electrical pulse comprising the quenching period including the initial portion and the subsequent portion.

15. The memory device of claim 14, wherein the control unit is further to program the memory cell with a staircase up sequence of electrical pulses.

16. The memory device of claim 11, wherein the memory cells comprise multi-level memory cells.

17. A system, comprising:
a processor to generate a memory access command; and
a memory device comprising a plurality of memory cells, wherein the memory device is communicatively coupled to the processor;
the memory device to program a memory cell of the plurality of memory cells with a sequence of electrical pulses at least in part in response to receiving the memory access command, wherein the sequence comprises a set electrical pulse, and wherein the sequence also comprises an electrical pulse, wherein a fall time of an initial portion of a quenching period of the electrical pulse is less than a fall time of a subsequent portion of the quenching period.

18. The system of claim 17, wherein the memory device is to select the subsequent portion based at least in part on a target programmed state specified at least in part by the memory access command.

19. The system of claim 17, wherein the plurality of memory cells comprises multi-level memory cells.

* * * * *